United States Patent [19]

Amanai

[11] Patent Number: 5,309,397
[45] Date of Patent: May 3, 1994

[54] READ ONLY MEMORY DEVICE EQUIPPED WITH OUTPUT DATA BUFFER CIRCUITS LESS AFFECTABLE BY NOISES ON POWER VOLTAGE LINE

[75] Inventor: Masakazu Amanai, Tokyo, Japan

[73] Assignee: NEC Corporation, Tokyo, Japan

[21] Appl. No.: 932,701

[22] Filed: Aug. 20, 1992

[30] Foreign Application Priority Data

Aug. 29, 1991 [JP] Japan .................................. 3-244401

[51] Int. Cl.$^5$ ................................................ G11C 7/00
[52] U.S. Cl. ............................. 365/189.05; 365/194; 365/203; 365/206; 365/208
[58] Field of Search .................. 365/189.05, 194, 203, 365/206, 208

[56] References Cited

FOREIGN PATENT DOCUMENTS 0114194  9/1981  Japan ................................... 365/203

Primary Examiner—Eugene R. LaRoche
Assistant Examiner—Huan Hoang
Attorney, Agent, or Firm—Sughrue, Mion, Zinn, Macpeak & Seas

[57] ABSTRACT

A read only memory device firstly charges a digit line and, thereafter, couples the digit line with a discharging line so as to see whether or not a selected memory cell location provides a current path to the discharging line, wherein an n-channel enhancement type transfer transistor is coupled between a column selector and an output driver circuit for introducing time delay into undesirable voltage fluctuation due to noises on the discharging line, thereby preventing an output data signal from undesirable inversion.

5 Claims, 7 Drawing Sheets

READ ONLY MEMORY DEVICE EQUIPPED WITH OUTPUT DATA BUFFER CIRCUITS LESS AFFECTABLE BY NOISES ON POWER VOLTAGE LINE

FIELD OF THE INVENTION

This invention relates to a read only memory device and, more particularly, to an output data buffer circuit incorporated in the read only memory device.

DESCRIPTION OF THE RELATED ART

A typical example of the read only memory device is illustrated in FIG. 1, and largely comprises a plurality of memory cell blocks 11, 12 to 1n, a plurality of column selector circuits 21, 22 to 2n, a plurality of output data buffer circuits 31, 32 to 3n, and a discharging circuit 4. Each of the memory cell blocks 11 to 1n has a plurality of memory cell locations M11 to Mxy arranged in rows and columns, and n-channel enhancement type memory transistors Q1 selectively occupy the memory cell locations M11 to Mxy. A plurality of word lines AX1 to AXx are shared between the memory cell blocks 11 to 1n, and are associated with the rows of the memory cell locations M11 to M1y, M21 to M2y, .... and Mx1 to Mxy of the memory cell blocks 11 to 1n, respectively. A plurality of sets of digit lines D11 to D1y, D21 to D2y, ... and Dn1 to Dny are further provided for the plurality of memory cell blocks 11 to 1n, and each set of digit lines are associated with the columns of the memory cell locations M11 to Mx1, M12 to Mx2, ... and M1y to MxY. If a memory cell location is occupied by an n-channel enhancement type memory transistor, the associated word line is coupled with the gate electrode of the n-channel enhancement type memory transistor, and allows the n-channel enhancement type memory transistor to provide a conductive channel forming a part of the associated digit line upon elevation to the positive power voltage level. However, while the associated word line remains in the ground voltage level, the n-channel enhancement type memory transistor cuts off the associated digit line. On the other hand, if any n-channel enhancement type memory transistor does not occupy a memory cell location, the memory cell location is conductive at all times regardless of the voltage level on the associated word line, and the associated digit line passes through the memory cell location. Thus, the prior art read only memory device stores data bits by selectively forming the n-channel enhancement type memory transistors Q1 at the memory cell locations M11 to Mxy, and the n-channel enhancement type memory transistor Q1 is indicative of logic "0" level of a data bit.

The column selector circuits 21 to 2n are respectively associated with the plurality of sets of digit lines D11 to D1y, ... and Dn1 to Dny, and are accompanied by the output data buffer circuits 31 to 3n, respectively. Each of the column selector circuits 21 to 2n are comprised of a plurality of n-channel enhancement type transfer transistors Q21 to Q2y, and are coupled between the associated set of digit lines D11 to D1y, ... or Dn1 to Dny and the associated output data buffer circuit 31, 32, ... or 3n. A plurality of decoded address signal lines AY1 to AYy are shared between the column selector circuits 21 to 2n. The n-channel enhancement type transfer transistors Q21 to Q2y of the column selector circuits 21 to 2n are gated by the decoded address signal lines AY1 to AYy. When column address bits are decoded by a column decoder circuit (not shown), one of the decoded address signal lines AY1 to AYy is lifted to the positive power voltage level, and the associated n-channel enhancement type transfer transistors turn on so that each of the output data buffer circuits 31 to 3n is coupled with one of the associated digit lines.

Each of the output data buffer circuits 31 to 3n is comprised of an inverter 5 coupled between the output node Y1, Y2, ... or Yn of the associated column selector circuit 21, 22, ... or 2n and a data output node 61, 62 or 6n, and a p-channel enhancement type charging transistor Q3 coupled between a positive power voltage line Vdd and the output node Y1, Y2, ... or Yn of the associated column selector circuit 21, 22, ... or 2n. The p-channel enhancement type charging transistor Q3 is responsive to a precharge signal PR, and all of the p-channel enhancement type charging transistors Q3 concurrently turn on when the precharge signal PR goes down to the ground voltage level.

The discharging circuit 4 is comprised of a plurality of sets of n-channel enhancement type discharging transistors Q4 coupled between the respective digit lines D11 to Dny and a ground voltage line GND, and all of the n-channel enhancement type discharging transistors Q4 are responsive to a discharging signal DS of the positive power voltage level so as to couple the digit lines D11 to Dny with the ground voltage line GND. While data bits stored in the memory cell blocks 11 to 1n are accessed, the discharging signal DS is first decayed to the ground voltage level, and all of the n-channel enhancement type discharge transistors Q4 are turned off so as to allow the digit lines D11 to Dny to be charged. Thereafter, the discharging signal DS goes up to the positive power voltage level again, and digit lines D11 to Dny are selectively conducted with the ground voltage line GND depending upon the logic levels of the accessed data bits.

The prior art read only memory device thus arranged behaves as follows. FIG. 2 illustrates the circuit behavior of the prior art read only memory device, and "H", "L" and "M" respectively stand for the positive power voltage level Vdd, the ground voltage level GND and a positive voltage level lower than the positive power voltage level Vdd by the threshold level of the n-channel enhancement type transfer transistor Q21, Q22, ... or Q2y. Assuming now that the precharging signal PR and the discharging signal DS go down to the ground voltage level L at time t1, the output nodes Y1 to Yn are coupled through the p-channel enhancement type charge transistors Q3 with the positive power voltage line Vdd, and the digit lines D11 to Dny are isolated from the ground voltage line GND. The output nodes Y1 to Yn go up to a certain positive voltage level P1 between the ground voltage level L and the positive power voltage level H. If the word lines AX1 to AXx and the decoded address signal lines AY1 to AYy are selectively lifted to the positive power voltage level H at time t2, the output nodes Y1 to Yn are transiently decayed. However, the p-channel enhancement type charge transistors Q3 lift the output nodes Y1 to Yn to the positive power voltage level H. However, the selected digit lines are saturated at the positive voltage level M due to the n-channel enhancement type transfer transistors Q21 to Q2y.

Upon completion of the precharging phase, the precharging signal PR and the discharging signal DS are recovered from the ground voltage level L to the positive power voltage level H at time t3, and the output nodes Y1 to Yn are isolated from the positive power voltage line Vdd. The n-channel enhancement type discharge transistors Q4 provide the conductive channels between the digit lines D11 to Dny and the ground voltage line GND, and the selected digit lines are selectively discharged depending upon the accessed data bits. Namely, if one of the accessed data bits has logic "0" level, the n-channel enhancement type memory transistor Q1 is provided at the selected memory cell location, and cuts off the associated digit line. As a result, the selected digit line is maintained at the positive voltage level M, and the positive power voltage level H at the associated output node is inverted by the associated inverter 5 for producing an output data bit of logic "0" level. However, if another accessed data bit has logic "1" level, any n-channel enhancement type memory transistor Q1 is not provided at the selected memory location, and the selected digit line is discharged to the ground voltage level L. Then, the associated output node is also discharged, and the associated inverter 5 produces an output data bit of logic "1" level.

However, a problem is encountered in the prior art read only memory device in that the output data bit is liable to be inverted from logic "0" level corresponding to the ground voltage level L to logic "1" level corresponding to the positive power voltage level H due to noise on the ground voltage line GND. In detail, if an accessed memory location is occupied by the n-channel enhancement type memory transistor Q1, the associated word line remains at the ground voltage level, and the associated digit line is cut off by the n-channel enhancement type memory transistor Q1. However, if noise is present, the ground voltage line GND is decayed below the ground voltage level L, and differential voltage between the gate electrode and the drain node of the memory transistor Q1 exceeds the threshold level thereof over time period T1 between time t4 and time t7. The n-channel enhancement type memory transistor Q1 temporarily turns on, and discharges the associated digit line over the time period T1. The voltage drop on the digit line is relayed to the associated output node. Even if the output node is maintained the threshold level of the inverter 5 over time period T2 between time t5 and t7, the output node goes down below the threshold level of the inverter 5 at time t6, and the inverter 5 lifts the associated data output node to the positive power voltage level H. If the precharging signal PR goes down to the ground voltage level at time t7 for the next access, the associated output node is recovered from the low level toward the positive power voltage level H, and the data output node is decayed to the ground voltage level at time t8. Thus, the malfunction is liable to take place due to noise, and the output data bit is less reliable in noisy circumstances.

SUMMARY OF THE INVENTION

It is therefore an important object of the present invention to provide a read only memory device which is less affectable by noise on a ground voltage line.

To accomplish the object, the present invention proposes to introduce a time delay into the propagation of an undesirable voltage fluctuation on an associated digit line to an output driver circuit.

In accordance with the present invention, there is provided a read only memory device comprising: a) a plurality of memory locations arranged in rows and columns, and each having a current path or an enhancement type memory transistor depending upon a data bit stored therein; b) a plurality of word lines respectively associated with the rows of the plurality of memory locations, and coupled with gate electrodes of the enhancement type memory transistors of the associated rows, respectively, the plurality of word lines being selectively shifted between active level and inactive level; c) a plurality of digit lines respectively associated with the columns of the plurality of memory locations, a conductive channel produced in each enhancement type memory transistor and the current path of the columns forming parts of the associated digit lines; d) a discharging circuit responsive to a discharging signal for coupling the plurality of digit lines with a discharging line; e) a column selector means coupled with the plurality of digit lines, and responsive to decoded signals for coupling one of the plurality of digit lines with an output node thereof; f) an output buffer circuit comprising f-1) an output driver means coupled with a data output node for producing an output data signal, f-2) a delay means coupled between the output node of the column selector means and an input node of the output driver means, and operative to introduce time delay into propagation of voltage fluctuation from the output node of the column selector means to the input node of the output driver means, and f-3) a precharging means coupled between a source of current and the output node of the column selector means and between the source of current and the input node of the output driver means for precharging the output node and the input node.

BRIEF DESCRIPTION OF THE DRAWINGS

The features and advantages of the read only memory device according to the present invention will be more clearly understood from the following description taken in conjunction with the accompanying drawings in which.

DESCRIPTION OF THE PREFERRED EMBODIMENTS

First Embodiment

Figure 1:
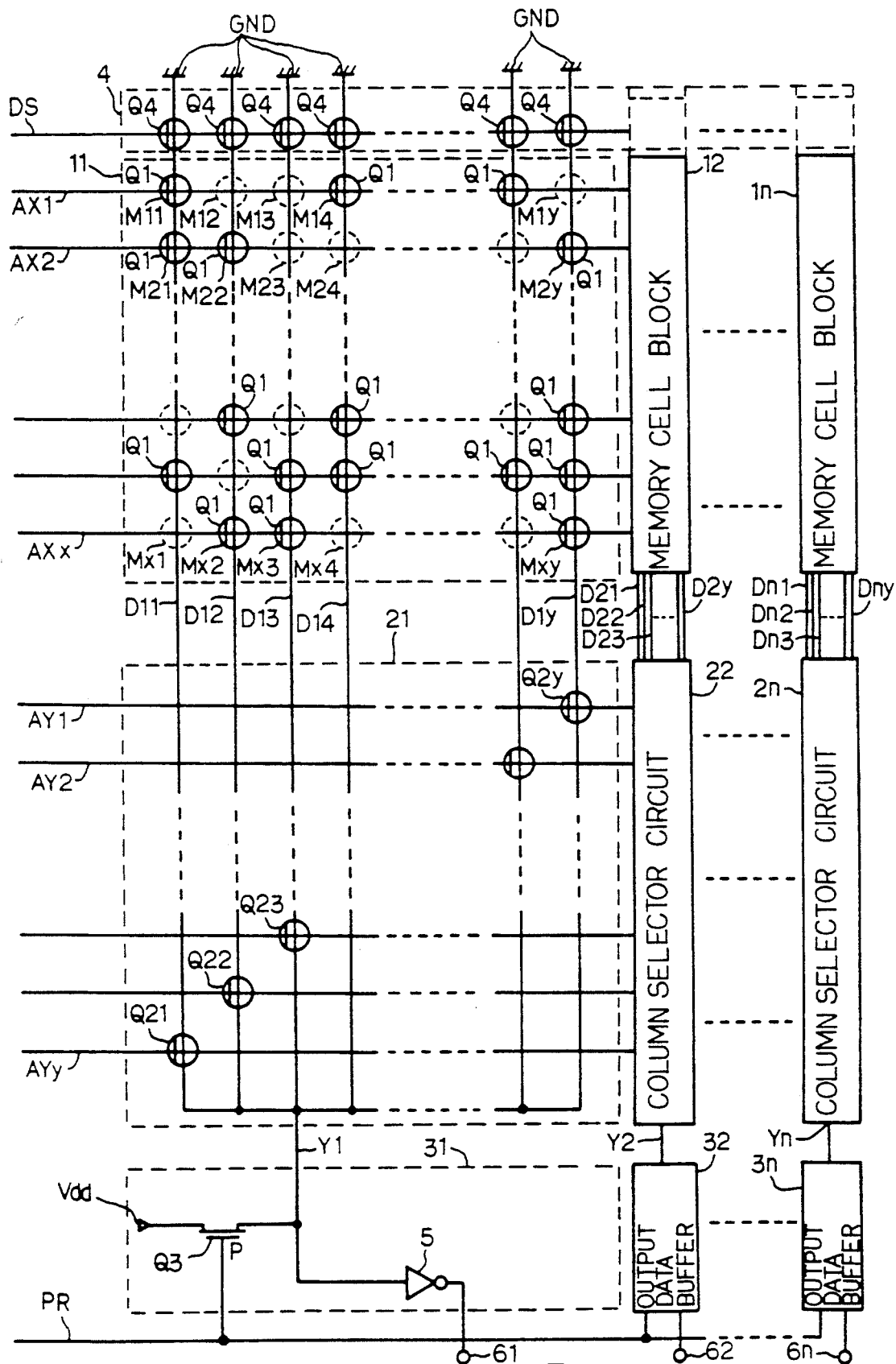
FIG. 1 is a circuit diagram showing the arrangement of the prior art read only memory device.
Figure 2:
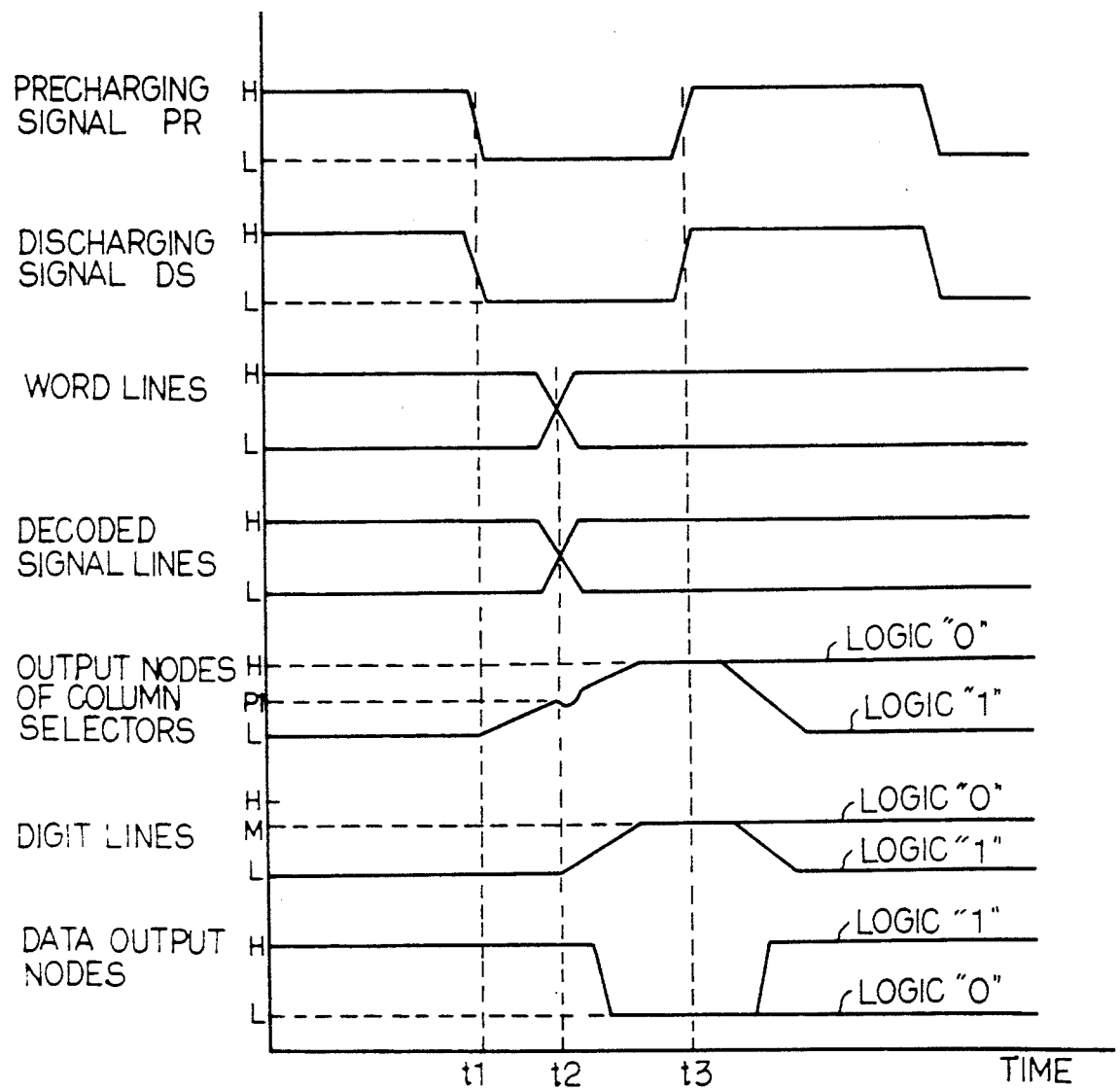
FIG. 2 is a diagram showing the circuit behavior of the prior art read only memory device.
Figure 3:
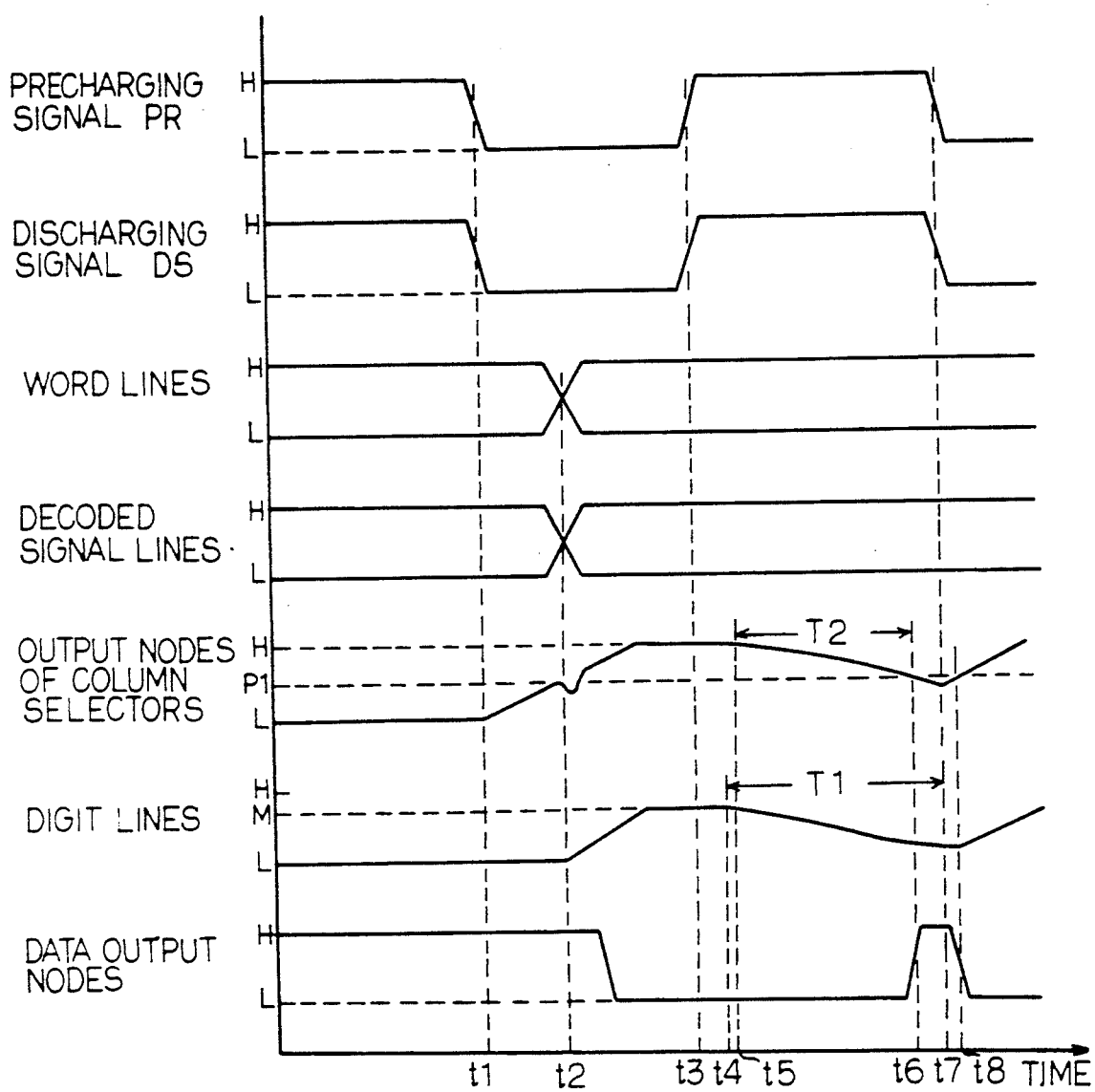
FIG. 3 is a diagram showing malfunction of the prior art read only memory device due to noises on the ground voltage line.
Figure 4:
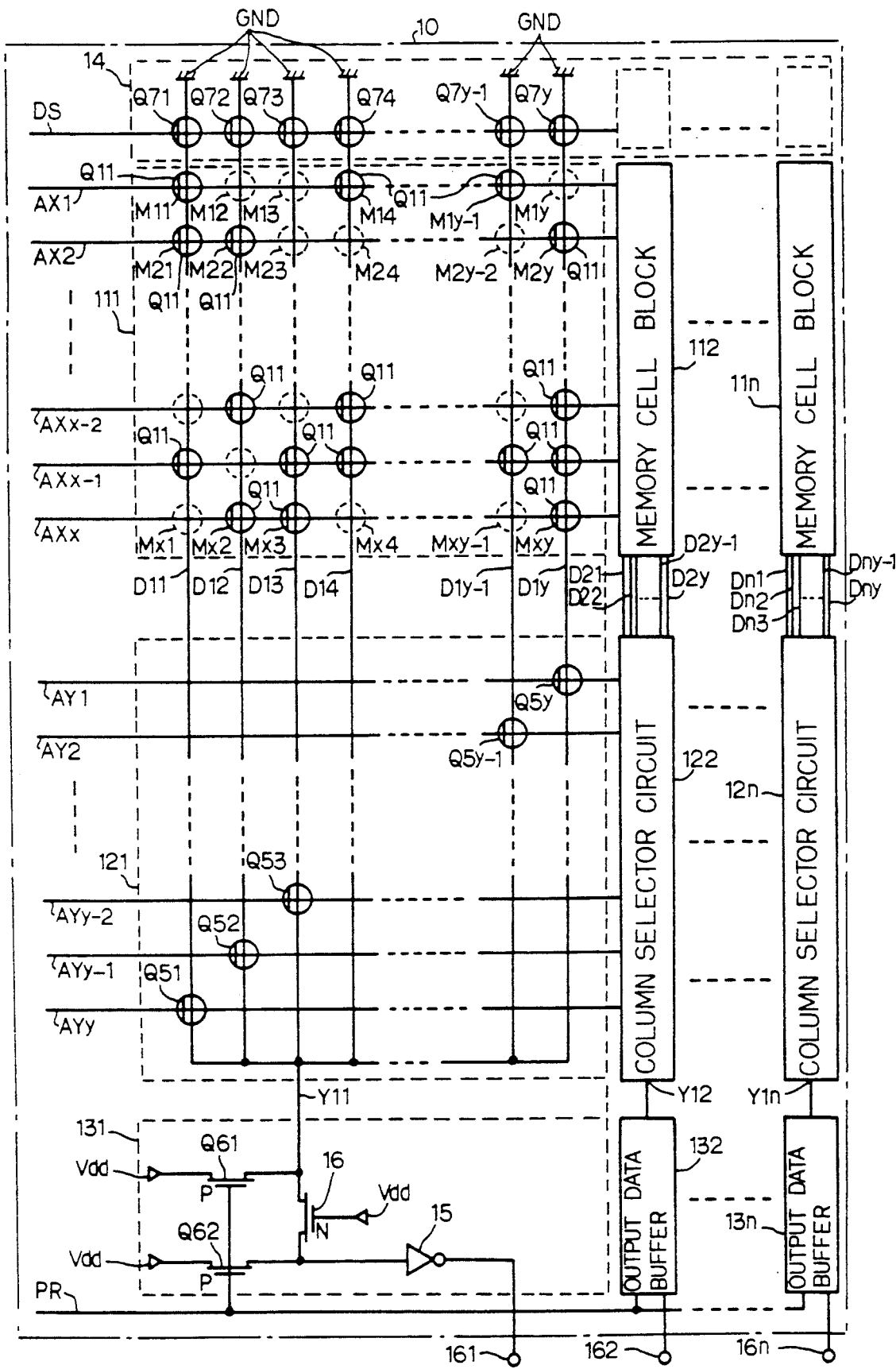
FIG. 4 is a circuit diagram showing the arrangement of a read only memory device according to the present invention.

Referring to FIG. 4 of the drawings, a read only memory device embodying the present invention is fabricated on a single semiconductor chip 10, and largely comprises a plurality of memory cell blocks 111, 112 and 11n, a plurality of column selector circuits 121, 122 and 12n, a plurality of output data buffer circuits 131, 132 and 13n, and a discharging circuit 14. The plurality of column selector circuits 121 to 12n and the plurality of output data buffer circuits 131 to 13n are respectively associated with the plurality of memory cell blocks 111 to 11n. Although other component circuits such as, for example, an address decoder and a timing controller are further incorporated in the read only memory device, these component circuits are deleted from FIG. 4, because they are less important for understanding the present invention.

Each of the memory cell blocks 111 to 11n has a plurality of memory cell locations M11 to Mxy arranged in rows and columns, and n-channel enhancement type memory transistors Q1 selectively occupy the memory cell locations M11 to M1y, M21 to M2y, . . . and Mx1 to Mxy. A plurality of word lines AX1 to AXx are shared between the memory cell blocks 111 to 11n, and are respectively associated with the rows of the memory cell locations M11 to M1y, M21 to M2y, . . . and Mx1 to Mxy of the memory cell blocks 111 to 11n. A plurality of sets of digit lines D11 to D1y, D21 to D2y, . . . and Dn1 to Dny are further provided for the plurality of memory cell blocks 111 to 11n, and each set of digit lines D11 to D1y, D21 to D2y or Dn1 to Dny are associated with the columns of the memory cell locations M11 to Mx1, M12 to Mx2, . . . and M1y to Mxy of one of the memory cell blocks 111 to 11n. The memory cell locations M11 to Mxy are selectively occupied by an n-channel enhancement type memory transistors Q11 and current paths, and channel regions of the n-channel enhancement type memory transistors Q11 and the current paths form parts of the associated digit lines D11 to Dny. The current paths may be implemented by channel regions of depletion type memory transistors. The n-channel enhancement type memory transistors Q11 are indicative of data bits of logic "0" level, and current paths represent data bits of logic "1" level. If a memory cell location is occupied by an n-channel enhancement type memory transistor, the associated word line is coupled with the gate electrode of the n-channel enhancement type memory transistor, and allows the n-channel enhancement type memory transistor to provide a conductive channel forming a part of the associated digit line upon elevation to a positive power voltage level. However, while the associated word line remains in the ground voltage level, the n-channel enhancement type memory transistor cuts off the associated digit line, and no current flows therethrough. On the other hand, if a current path is formed in a memory cell location at all times, the memory cell location allows current to pass therethrough regardless of the voltage level on the associated word line.

The plurality sets of digit lines D11 to D1y, . . . and Dn1 to Dny are respectively coupled with the column selector circuits 122 to 12n the respective output nodes Y11, Y12, . . . and Y1n of which in turn are coupled with the associated output data buffer circuits 131 to 13n. Each of the column selector circuits 121 to 12n comprises a plurality of n-channel enhancement type transfer transistors Q51 to Q5y, and are coupled between the associated set of digit lines D11 to D1y, . . or Dn1 to Dny and the output nodes Y11 to Y1n thereof A plurality of decoded address signal lines AY1 to AYy are shared between the column selector circuits 21 to 2n, and the n-channel enhancement type transfer transistors Q21 to Q2y of the column selector circuits 21 to 2n are gated by the decoded address signal lines AY1 to AYy. When column address bits are decoded address by a column decoder circuit (not shown), one of the decoded signal lines AY1 to AYY is lifted to the positive power voltage level, and the associated n-channel enhancement type transfer transistors turn on so that each of the output data buffer circuits 131 to 13n is coupled with one of the associated digit lines.

Each of the output data buffer circuits 131 to 13n is comprised of an inverter 15 coupled between one of the data output nodes 161, 162 and 16n, an n-channel enhancement type transfer transistor 16 coupled between the associated output node Y11, Y12, . . . or Y1n and the inverter 15, and a pair of p-channel enhancement type charging transistors Q61 and Q62 coupled between a positive power voltage line Vdd and the source/ drain nodes of the n-channel enhancement type transfer transistor 16. The gate electrode of the n-channel enhancement type transfer transistor 16 is coupled with the positive power voltage line Vdd, and is, accordingly, shifted between on-state and off-state depending upon the voltage level at either source/ drain node thereof. The p-channel enhancement type charging transistors Q61 and Q62 are responsive to a precharge signal PR, and all of the p-channel enhancement type charging transistors Q61 and Q62 of the output data buffer circuits 131 to 13n concurrently turn on when the precharge signal PR goes down to the ground voltage level.

The discharging circuit 14 comprises a plurality sets of n-channel enhancement type discharging transistors Q71 to Q7y coupled between the respective digit lines D11 to D1y, D21 to D2y, and Dn1 to Dny and a ground voltage line GND, and all of the n-channel enhancement type discharging transistors Q71 to Q7y are responsive to a discharging signal DS of the positive power voltage level so as to couple the digit lines D11 to Dny with the ground voltage line GND. While data bits stored in the memory cell blocks 11 to 1n are accessed, the discharging signal DS is first decayed to the ground voltage level, and all of the n-channel enhancement type discharge transistors Q71 to Q7y are turned off so as to allow the output data buffer circuits 131 to 13n charge the digit lines D11 to Dny. Thereafter, the discharging signal DS goes up to the positive power voltage level again, and digit lines D11 to Dny are selectively conducted with the ground voltage line GND depending upon the logic levels of the accessed data bits.

Figure 5:
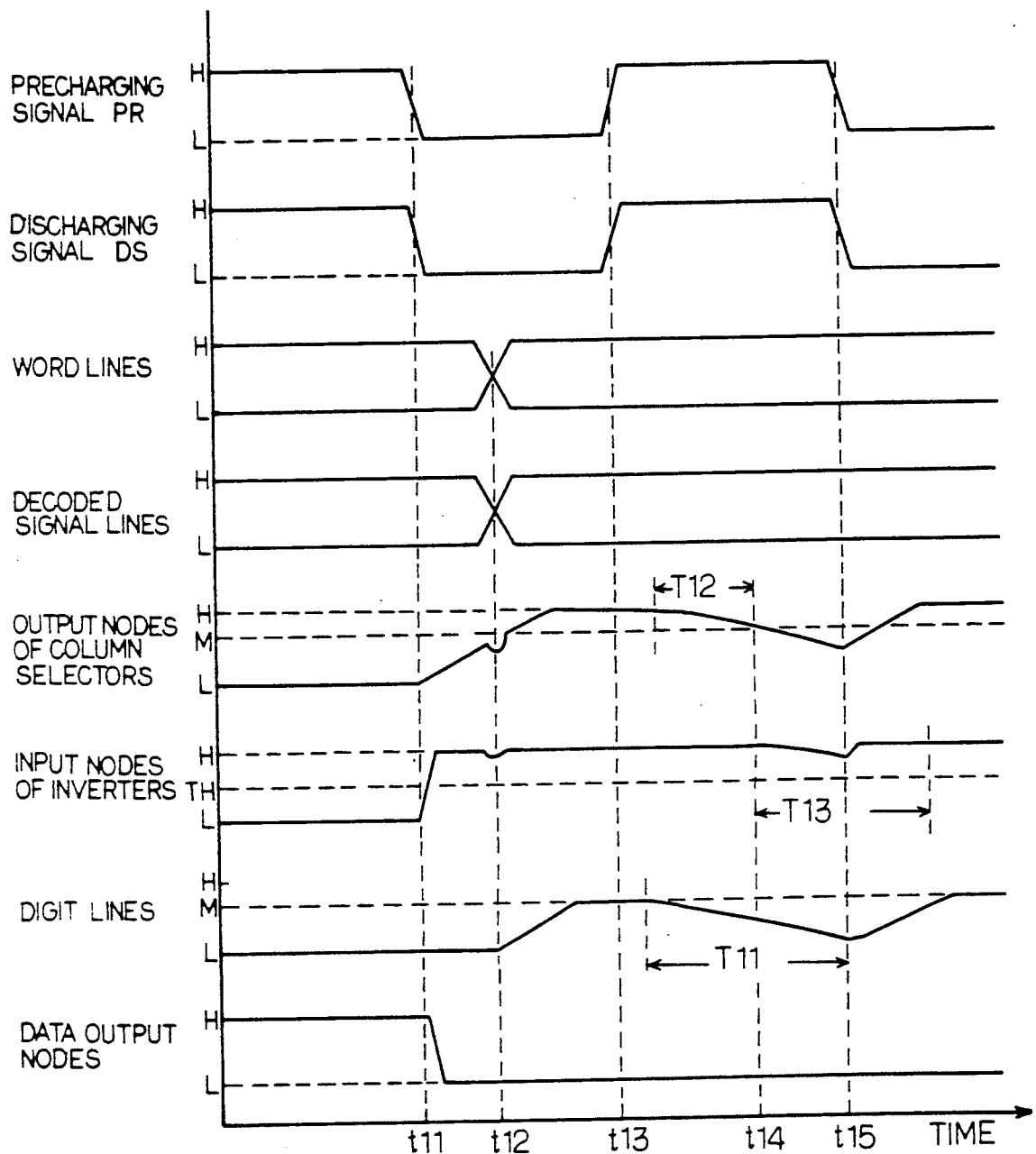
FIG. 5 is a diagram showing the circuit behavior of the read only memory device shown in FIG. 4.

The read only memory device thus arranged behaves as follows. FIG. 5 illustrates the circuit behavior of the read only memory device implementing the first embodiment, and "H", "L" and "M" respectively stand for the positive power voltage level, the ground voltage level and a positive voltage level lower than the positive power voltage level Vdd by the threshold level of the n-channel enhancement type transfer transistor Q51, Q52, . . ., Q5y or 16. The threshold level of the inverters 15 is indicated by "TH" in FIG. 5. Each read-out operation is broken down into a precharging phase and a detecting phase after the precharging phase. Assuming now that the precharging signal PR and the discharging signal DS go down to the ground voltage level L at time t11, the read only memory device enters the precharging phase, and the output nodes Y11 to Y1n and the input nodes of the inverters 15 are coupled through the p-channel enhancement type charge transistors Q61 and Q62 with the positive power voltage line Vdd, and the digit lines D11 to Dny are isolated from the ground voltage line GND. The output nodes Y11 to Y1n go up toward the positive voltage level M, and the input nodes of the inverters 15 rapidly go to the positive power voltage level H. If the word lines AX1 to AXx and the decoded signal lines AY1 to AYY are selectively lifted to the positive power voltage level H at time t12, the output nodes Y11 to Y1n are transiently decayed. However, the p-channel enhancement type charge transistors Q61 lift the output nodes Y11 to Y1n to the positive power voltage level H, and the selected digit lines are saturated at the positive voltage level M due to the n-channel enhancement type transfer transistors Q51 to Q5y. When the output nodes Y11 to Y1n and the input nodes of the inverters 15 exceed the positive voltage level M, the n-channel enhancement type transfer transistors 16 turn off.

Upon completion of the precharging phase, the precharging signal PR and the discharging signal DS are recovered from the ground voltage level L to the positive power voltage level H at time t13, and the read only memory device proceeds with the detecting phase. The p-channel enhancement type charge transistors Q61 and Q62 concurrently turn off, and the output nodes Y11 to Y1n and the input nodes of the inverters 15 are isolated from the positive power voltage line Vdd. However, the n-channel concurrently turn on, and provide the conductive channels between the digit lines D11 to Dny and the ground voltage line GND. As a result, the selected digit lines are selectively discharged depending upon the accessed data bits. Namely, if one of the accessed data bits has logic "0" level, the n-channel enhancement type memory transistor Q11 is provided at the selected memory cell location, and cuts off the associated digit line. The selected digit line is maintained at the positive voltage level M, and the positive power voltage level H at the associated output node is inverted by the associated inverter 15 for producing an output data bit of logic "0" level corresponding to the ground voltage level L. However, if another accessed data bit has logic "1" level, the current path is provided at the selected memory location instead of the n-channel enhancement type memory transistor Q11, and the selected digit line is discharged to the ground voltage level L. Then, the output node of the associated column selector circuit is also discharged, and the associated inverter 5 produces an output data bit of logic "1" level corresponding to the positive power voltage level H.

If noise rides on the ground voltage line GND, the n-channel channel enhancement type memory transistor Q11 of the selected memory cell location undesirably turns on, and the associated digit line and the output node of the column selector coupled thereto are decayed over time period T11. However, the n-channel enhancement type transfer transistor 16 is kept off until the output node of the column selector becomes lower than the positive voltage level M. If the output node of the column selector reaches the positive voltage level M after time period T12, this enhancement type transistor 16 turns on. Thus, the n-channel enhancement type transfer transistor a 16 introduces time delay equal to time period T12, and, for this reason, the n-channel enhancement type transfer transistors 16 serves as a delay means.

After time t14, the input node of the inverter 15 is decayed. However, the next precharging phase starts at time t15, and the input node of the inverter 15 does not become lower than the threshold level TH. This results in that the output data bit is maintained in logic "0" level, and the output data buffer circuits 131 to 13n are free from the noise on the ground voltage line GND. In general, if the input node of the inverter 15 needs time period T13 before reaching the threshold level TH, the output data buffer circuits 131 to 13n are free from noise in so far as the sum of time periods T12 and T13 is longer than time period T11.

Second Embodiment

Figure 6:
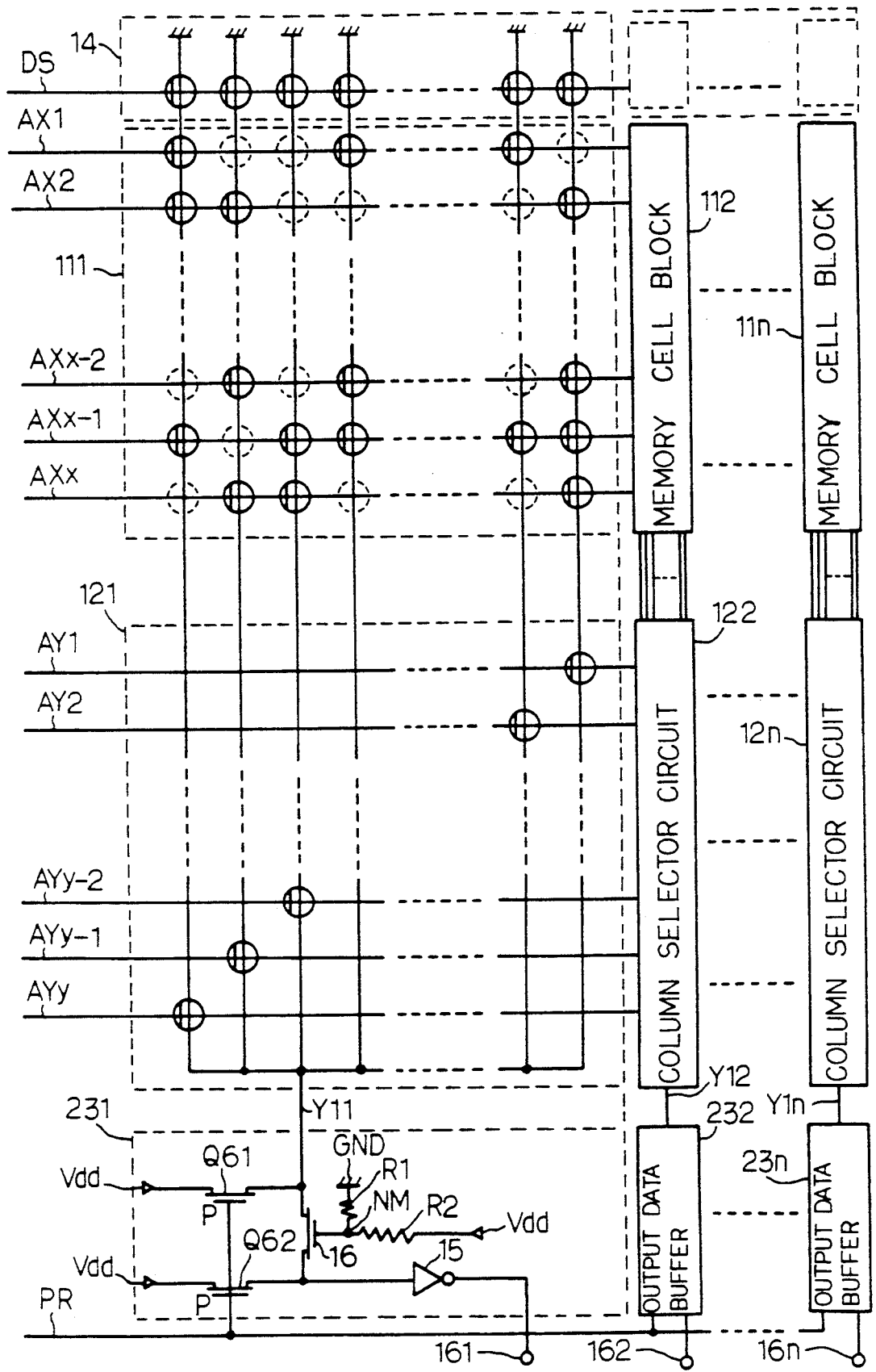
FIG. 6 is a circuit diagram showing the arrangement of another read only memory device according to the present invention.

Turning to FIG. 6 of the drawings, another read only memory device embodying the present invention is illustrated. Difference from the first embodiment is a voltage divider implemented by resistors R1 and R2 coupled between the positive power voltage line Vdd and the ground voltage line GND, and an intermediate node NM between the resistors R1 and R2 is coupled with the gate electrode of each n-channel enhancement type transfer transistor 16. However, other component circuits are similar to those of the first embodiment, and are labeled with the same references designating the corresponding component circuits of the first embodiment.

Figure 7:
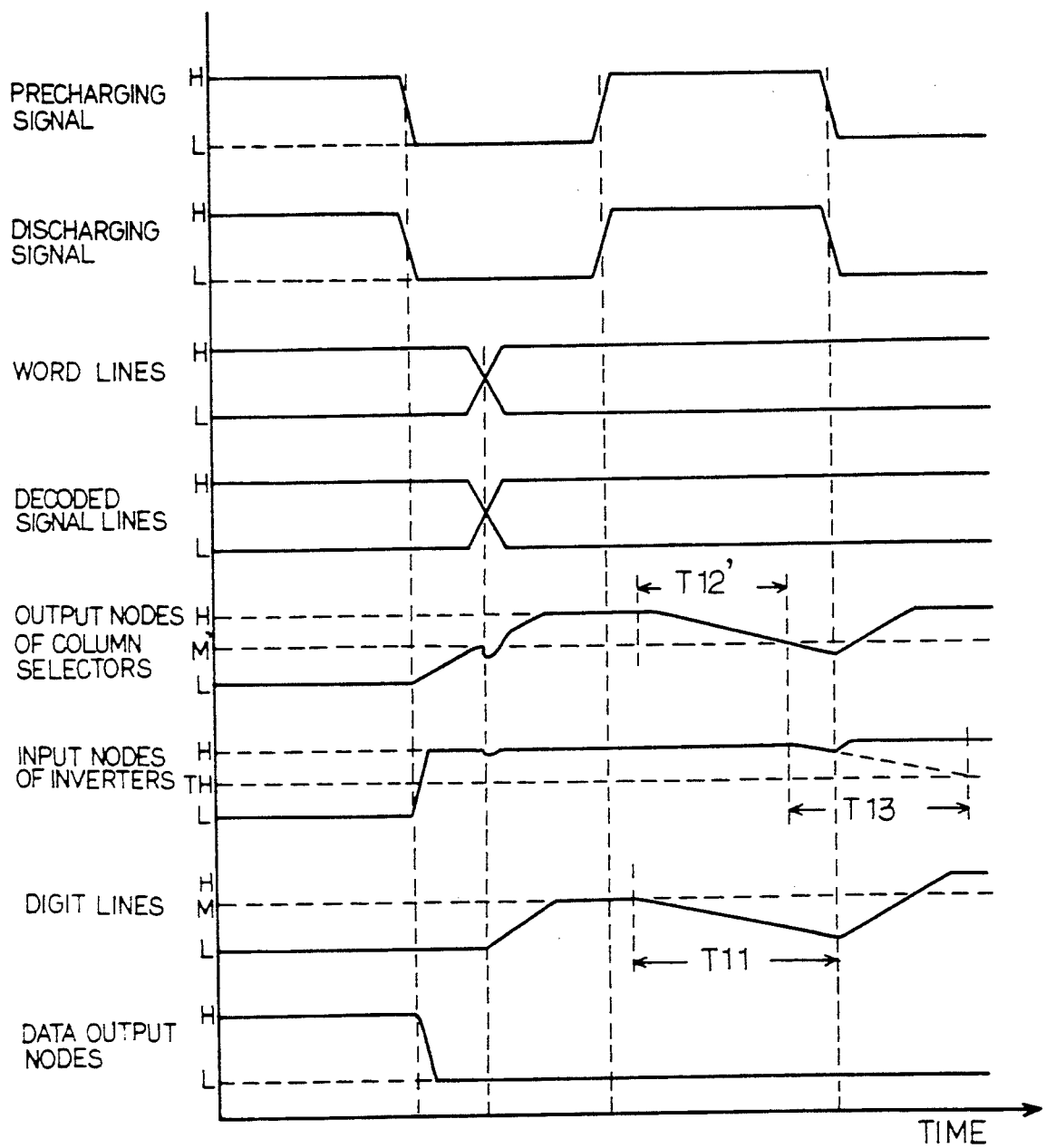
FIG. 7 is a diagram showing the circuit behavior of the read only memory device shown in FIG. 6.

The output data buffer circuits 231 to 23n thus arranged is less affectable with the noises on the ground voltage line GND rather than the output data buffer circuits 131 to 13n, because the n-channel enhancement type transfer transistors 16 are kept off until the output nodes Y11 to Y1n become much lower than those of the first embodiment. Namely, a positive voltage level M' in FIG. 7 is lower than the positive power voltage level H by the sum of the threshold level of the n-channel enhancement type transfer transistor 16 and the difference between the positive power voltage line Vdd and the intermediate node NM. For this reason, time period T12' is longer than time period T12, and, accordingly, the time delay is prolonged by the voltage divider. In this instance, the n-channel enhancement type transfer transistor 16 and the voltage divider implemented by the resistors R1 and R2 as a whole constitute a delay means. The other circuit behavior of the second embodiment is similar to that of the first embodiment, and no further description is incorporated for avoiding repetition.

As will be appreciated from the foregoing description, the output data buffer circuits according to the present invention are less affectable by the noises on the ground voltage line, and the output data signals are reliable in noisy circumstances.

Although particular embodiments of the present invention have been shown and described, it will be obvious to those skilled in the art that various changes and modifications may be made without departing from the spirit and scope of the present invention. For example, the aforementioned read only memory devices are of a standard memory product. However, the read only memory device according to the present invention may be incorporated in an ultra large scale integrated circuit device such as a single-chip microcomputer or in a semi-custom-made integrated circuit device.

What is claimed is:

1. A read only memory device comprising:
   a) a plurality of memory locations arranged in rows and columns, and each having a current path or an enhancement type memory transistor depending upon a data bit stored therein;
   b) a plurality of word lines respectively associated with the rows of said plurality of memory locations, and coupled with gate electrodes of said enhancement type memory transistors of the associated rows, respectively, said plurality of word lines being selectively shifted between active level and inactive level;

c) a plurality of digit lines respectively associated with the column of said plurality of memory locations, a conductive channel produced in each enhancement type memory transistor and said current path of said columns forming parts of said associated digit lines;

d) a discharging circuit responsive to a discharging signal for coupling said plurality of digit lines with a discharging line;

e) a column selector means coupled with said plurality of digit lines, and responsive to address signals indicative of a column address assigned to one of said plurality of digit lines for coupling said one digit line with an output node thereof;

f) an output buffer circuit comprising f-1) an output driver means coupled with a data output node for producing an output data signal, f-2) a delay means coupled between said output node of said column selector means and an input node of said output driver means, and operative to introduce time delay into propagation of voltage fluctuation from said output node of said column selector means to said input node of said output driver means, and f-3) a precharging means coupled between a source of current and said output node of said column selector means and between said source of current and said input node of said output driver means for precharging said output node and said input node.

2. A read only memory device as set forth in claim 1, in which said output driver means is implemented by an inverter.

3. A read only memory device as set forth in claim 1, in which said precharging means is implemented by two enhancement type precharge transistors operative to charge said output node of said column selector means and said input node of said output driver means, respectively.

4. A read only memory device as set forth in claim 1, in which said delay means comprises an enhancement type transfer transistor having a gate electrode coupled with said source of current and a source-to-drain path coupled between said output node of said column selector means and said input node of said output driver means.

5. A read only memory device as set forth in claim 1, in which said delay means comprises an enhancement type transfer transistor having a gate electrode coupled with said source of current and a source-to-drain path coupled between said output node of said column selector means and said input node of said output driver means, and a voltage divider coupled between said source of current and said discharging line, an intermediate node of said voltage divider being coupled with the gate electrode of said enhancement type transfer transistor.

* * * * *

UNITED STATES PATENT AND TRADEMARK OFFICE
CERTIFICATE OF CORRECTION

PATENT NO. : 5,309,397

DATED : May 3, 1994

INVENTOR(S) : Amanai

It is certified that error appears in the above-identified patent and that said Letters Patent is hereby corrected as shown below:

Col. 6, line 28, after "D2y,", insert --...---.

Col.7 , line 22, after "n-channel", insert --enhancement type discharge transistors Q71 to Q7y--.

Signed and Sealed this

Fifteenth Day of November, 1994

Attest:

BRUCE LEHMAN

Attesting Officer

Commissioner of Patents and Trademarks